（12）United States Patent
Ramsbey et al.

(10) Patent No.: US 9,209,197 B2
(45) Date of Patent: Dec. 8, 2015

(54) MEMORY GATE LANDING PAD MADE FROM DUMMY FEATURES

(71) Applicant: Spansion LLC, Sunnyvale, CA (US)

(72) Inventors: Mark Ramsbey, Sunnyvale, CA (US); Chun Chen, San Jose, CA (US); Unsoon Kim, San Jose, CA (US); Shenqing Fang, Fremont, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 75 days.

(21) Appl. No.: 13/715,828

(22) Filed: Dec. 14, 2012

(65) Prior Publication Data

US 2014/0167128 A1 Jun. 19, 2014

(51) Int. Cl.
| | |
|---|---|
| *H01L 29/792* | (2006.01) |
| *H01L 27/115* | (2006.01) |
| *H01L 21/768* | (2006.01) |
| *H01L 21/8234* | (2006.01) |
| *H01L 29/423* | (2006.01) |
| *H01L 29/66* | (2006.01) |
| *H01L 29/788* | (2006.01) |

(52) U.S. Cl.
CPC .... *H01L 27/11524* (2013.01); *H01L 21/76877* (2013.01); *H01L 21/76897* (2013.01); *H01L 21/823475* (2013.01); *H01L 27/11563* (2013.01); *H01L 27/11568* (2013.01); *H01L 29/42328* (2013.01); *H01L 29/66825* (2013.01); *H01L 29/7881* (2013.01)

(58) Field of Classification Search
None
See application file for complete search history.

(56) References Cited

U.S. PATENT DOCUMENTS

| | | | |
|---|---|---|---|
| 5,824,584 A | 10/1998 | Chen et al. | |
| 5,946,230 A | 8/1999 | Shimizu et al. | |
| 5,969,383 A | 10/1999 | Chang et al. | |
| 6,020,229 A | 2/2000 | Yamane et al. | |
| 6,180,461 B1 * | 1/2001 | Ogura | 438/266 |
| 6,972,997 B2 | 12/2005 | Ishimaru et al. | |
| 7,057,230 B2 | 6/2006 | Tanaka et al. | |
| 7,115,943 B2 | 10/2006 | Mine et al. | |
| 7,371,631 B2 | 5/2008 | Sakai et al. | |
| 7,414,283 B2 | 8/2008 | Tanaka et al. | |
| 7,504,689 B2 | 3/2009 | Hisamoto et al. | |
| 7,557,005 B2 | 7/2009 | Ishii et al. | |
| 7,663,176 B2 | 2/2010 | Sakai et al. | |
| 7,667,259 B2 | 2/2010 | Yasui et al. | |
| 7,700,992 B2 | 4/2010 | Tanaka et al. | |
| 7,723,779 B2 | 5/2010 | Hisamoto et al. | |

(Continued)

FOREIGN PATENT DOCUMENTS

KR  10-2004-0065039 A  7/2004

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

(Continued)

*Primary Examiner* — Robert Bachner
*Assistant Examiner* — Molly Reida (57) ABSTRACT

Embodiments described herein generally relate to landing gate pads for contacts and manufacturing methods therefor. A bridge is formed between two features to allow a contact to be disposed, at least partially, on the bridge. Landing the contact on the bridge avoids additional manufacturing steps to create a target for a contact.

15 Claims, 12 Drawing Sheets

(56) References Cited

U.S. PATENT DOCUMENTS

| | | | |
|---|---|---|---|
| 7,863,135 B2 | 1/2011 | Sakai et al. | |
| 7,863,670 B2 | 1/2011 | Ishii et al. | |
| 8,017,986 B2 | 9/2011 | Tanaka et al. | |
| 8,125,012 B2 | 2/2012 | Mine et al. | |
| 2007/0007550 A1* | 1/2007 | Bum | 257/202 |
| 2007/0218633 A1* | 9/2007 | Prinz et al. | 438/267 |
| 2007/0257302 A1 | 11/2007 | Kang et al. | |
| 2010/0202179 A1* | 8/2010 | Lo et al. | 365/51 |
| 2011/0095348 A1 | 4/2011 | Chakihara et al. | |
| 2011/0211396 A1 | 9/2011 | Takeuchi | |

OTHER PUBLICATIONS

Matsubara, K., et al., "Highly Reliable 10ns MONOS Flash," elmicro.com/files/renesas/monos_flash_ewc_2008_for_proceedings.pdf, Renesas Technology Europe GmbH, 2008.

Tanaka, T., et al., Hitachi, "A 512kB MONOS type Flash Memory Module Embedded in a Microcontroller," 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.

Yanagi, I., et al., "Quantum confinement effect of efficient hole injection in MONOS-type nonvolatile memory—the role of ultrathin i-Si/P$^+$ poly-Si stacked gate structure fabricated by laser spike annealing," 146-147, Symposium on VLSI Technology, Digest of Technical Papers, Central Research Laboratory, Hitachi Ltd., 2007.

International Search Report and Written Opinion of the International Searching Authority for International Application No. PCT/US2013/074659, mailed Apr. 29, 2014.

English language abstract of Korean Patent Publication No. 10-2004-0065039 A.

* cited by examiner

MEMORY GATE LANDING PAD MADE FROM DUMMY FEATURES

BACKGROUND

1. Technical Field

The embodiments described herein generally relate to non-volatile memory, such as charge trapping memory.

2. Background

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power applications.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having to pump the supply voltage to a higher level makes the read operation faster.

It is common to monolithically incorporate multiple types of field-effect devices on the same substrate as memory cells. Those non-memory devices perform, for example, decoding, charge-pumping, and other functions related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for device and methods for integrating a memory cell and other devices on the same substrate to facilitate improved cost, performance, reliability, or manufacturability.

BRIEF SUMMARY

It is desirable to obviate or mitigate at least one of the problems, whether identified herein or elsewhere, or to provide an alternative to existing apparatuses or methods.

In an embodiment, a method of fabricating a semiconductor. A polysilicon layer is disposed on a substrate. A plurality of features are formed in the polysilicon layer including at least one dummy feature. A charge trapping dielectric is disposed over the plurality of features. A further polysilicon layer is disposed on the plurality of features. A portion of the further polysilicon layer is removed to form a memory gate between one of the plurality of features and the one dummy feature. In the embodiment, a distance between the one of the plurality of features and the one dummy feature is less than a bridging distance so as to form a recess portion in the memory gate. Additionally, a contact to at least the recess portion of the memory gate is formed.

In an embodiment, a semiconductor device includes a substrate. There is a select gate on the substrate. There is a dummy feature on the substrate. There is a memory gate on the substrate. In this embodiment, the memory gate is located between two features so as to form a bridge portion that is below opposing edges of the two features. Additionally, there is a contact at least partially on the bridge portion.

In an embodiment, a semiconductor device including a substrate. There is a first feature on the substrate. There is a second feature on the substrate. There is a partially etched bridge of conductive material formed between the first feature and the second feature. There is a contact at least partially on the bridge.

These and other advantages and features will become readily apparent in view of the following detailed description of embodiments of the invention. Note that the Summary and Abstract sections may set forth one or more, but not all exemplary embodiments of the present invention as contemplated by the inventor(s). It is to be appreciated that the Detailed Description section, and not the Summary and Abstract sections, is intended to be used to interpret the claims.

BRIEF DESCRIPTION OF THE DRAWINGS/FIGURES

The accompanying drawings, which are incorporated herein and form part of the specification, illustrate the present invention and, together with the description, farther serve to explain the principles of the present invention and to enable a person skilled in the relevant art(s) to make and use the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. However, "removing" is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "deposit" or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc.

The term "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

The term "poly" as used throughout the descriptions is most commonly thought to be polycrystalline silicon. Poly comprises multiple small crystals, as opposed to being a single monocrystal. Poly can be doped, or may have metal or a metal silicide deposited over it.

"Poly" in this application is used as one example of a gate conductor. Other conductors may be used to form the gates, for example metals, alloys other doped semiconductors or conducting materials as would become apparent to a person having ordinary skill in the art. The use of "poly" in the description of the embodiments is not to be limiting.

Figure 1:
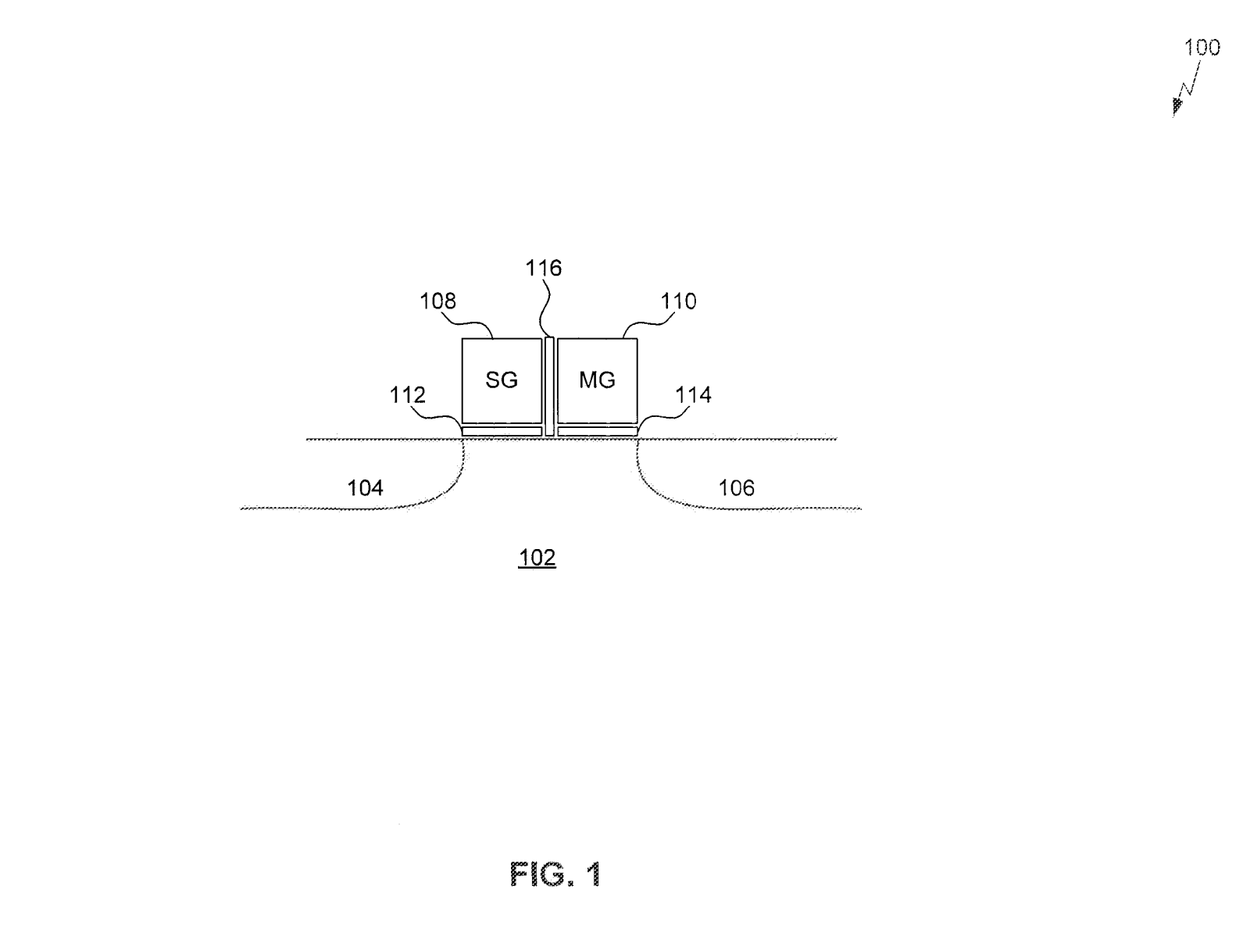
FIG. 1 illustrates an example of a split-gate non-volatile memory cell, according to an embodiment.

FIG. 1 illustrates an example of a split-gate non-volatile memory cell 100 according to an embodiment. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may be a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a silicon nitride layer sandwiched between two silicon dioxide layers to create a three-layer stack collectively and commonly referred to as "ONO". Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114. Regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of –8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and three volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
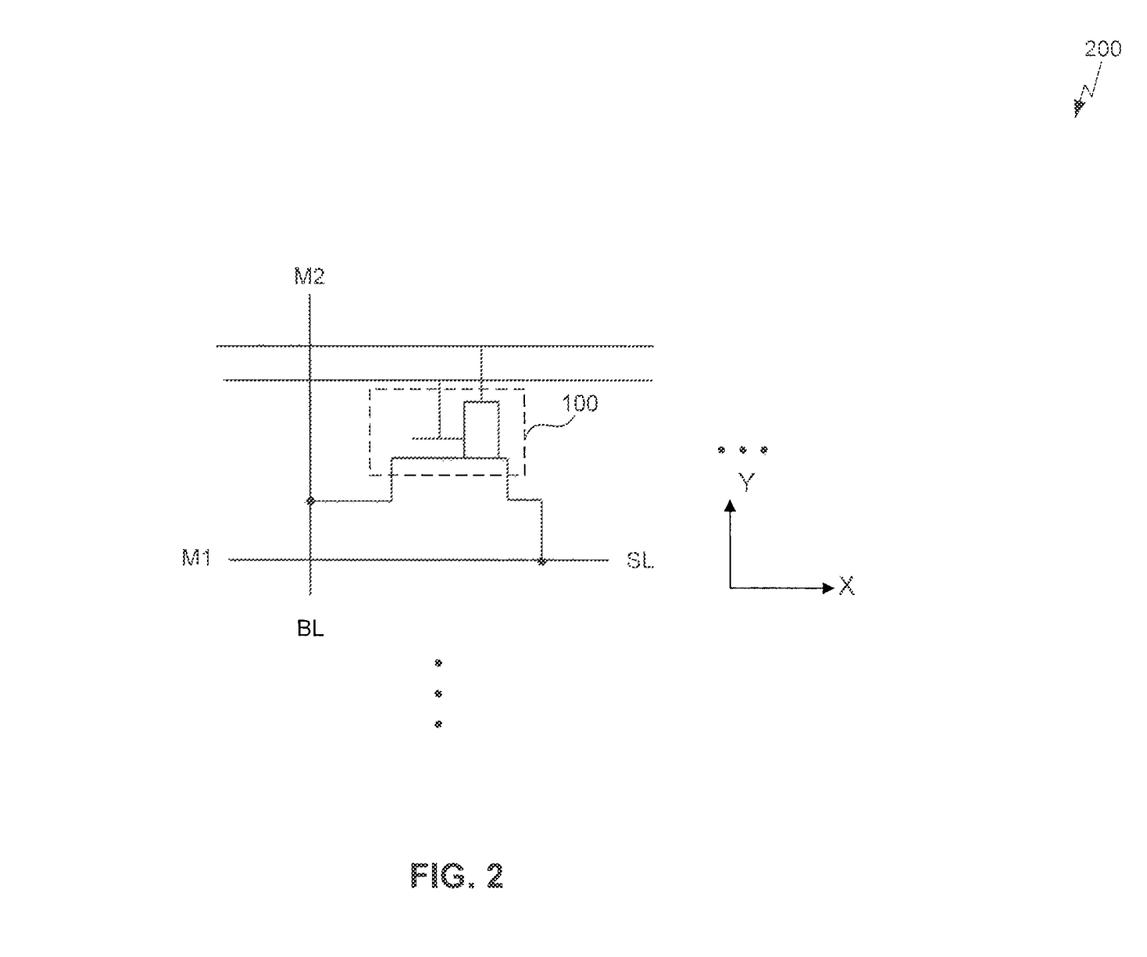
FIG. 2 illustrates an example circuit diagram of memory cell including connections to various metal layers in a semiconductor device, according to an embodiment.

FIG. 2 illustrates an example circuit diagram of memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
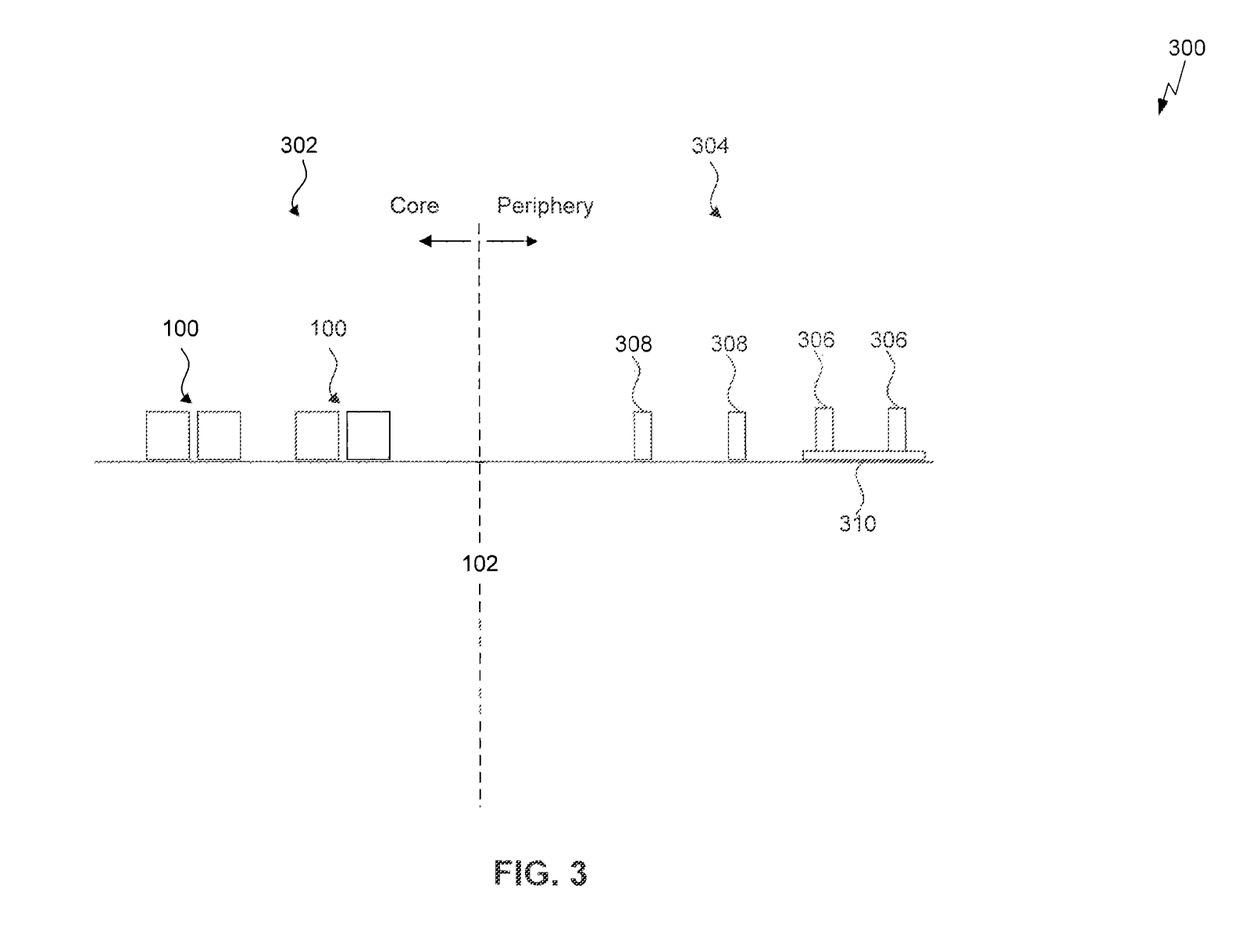
FIG. 3 illustrates an example semiconductor device that includes both memory and peripheral circuitry embedded in the same substrate, according to an embodiment.

FIG. 3 illustrates an example semiconductor device that includes both memory and peripheral circuitry in the same substrate. In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308.

The various minimum dimensions and tolerances involved in landing a contact create an engineering challenge. In order to function, a contact needs to be in electrical contact with its target. The target must be large enough to support the minimum footprint of the contact, but features to be avoided need to be far enough away from the target that the contact be designed to fit on the target without contacting a feature to be avoided. A smaller footprint of the contact therefore allows other devices to be disposed closer to together, thus improving performance.

Overlay error expands the minimum area needed for a contact. Overlay error refers to the possibility that a contact, or other feature, may not be disposed precisely where it is intended to be disposed. If a series of features are stacked on top of each other, and each is a little to the right (or left) of where it is intended to be, the stack of features could end up resembling the Leaning Tower of Pisa, which can have negative implications for the integrity of the device.

The minimum width of the contact is often 40 nanometers (nm) to 60 nm. The overlay tolerance can be 20 nm in either direction, for a total of 40 nm. The total width allotted to a contact is thus 80 nm to 100 mm Such a width is significantly larger than corresponding critical dimensions for manufacturing, which are on the order of 10 nm to 50 nm. Because the critical dimension is smaller than the minimum width needed for a contact, making a target large enough for the contact would, without other design changes, potentially create an electrical short the from the target feature to a different element of the semiconductor device, impairing the device.

One approach to creating a target that is large enough for a contact is to create a larger area feature for the contact to land on e.g., a "landing pad." However, this landing pad requires additional area on the silicon substrate. Also, in some embodiments the feature to be contacted is formed without using photolithography for example, the feature to be contacted may be formed as a sidewall spacer of another feature with a fixed width. An additional photolithography step which adds process complexity and manufacturing cost must be added to form the landing pad.

Figure 4A:
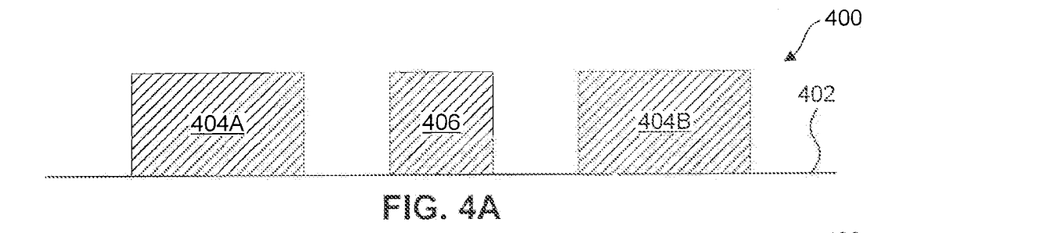
FIGS. 4A-4D illustrate a semiconductor device in various stages of manufacturing, according to an embodiment.

FIG. 4A illustrates a step in the method of fabrication of an intermediate semiconductor device 400. Many steps are required to create the structures on the substrate 402, such as disposing layers, masking, stripping, and the like, as would be apparent to a person having ordinary skill in the art. The semiconductor device 400 has a substrate 402. The method disposes a poly layer and patterns it to form two select gates 404A and 404B on substrate 402. Patterning the poly layer includes patterning to form a dummy feature 406. This instance of poly is called a dummy feature 406 because it will not comprise a feature of an active device, as opposed to a select gate 404 or a bit line, for example. The dummy feature's 406 primary purpose is a physical one. A dummy feature 406 may also be known as an assist feature 406.

Figure 4B:
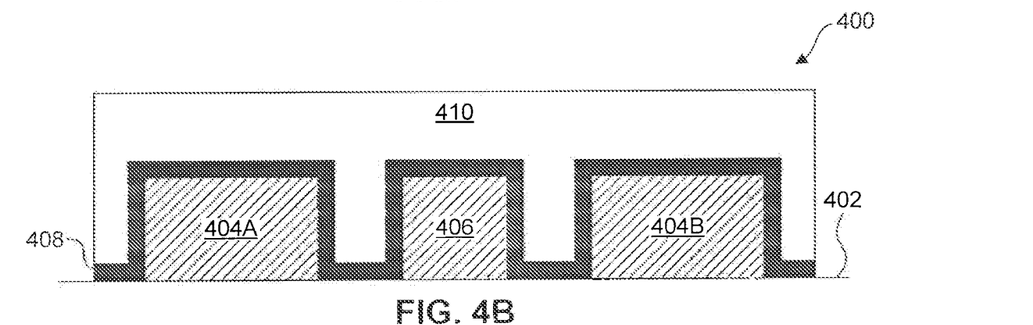

FIG. 4B illustrates a later step in the method of fabrication to form an intermediate semiconductor device 400. The method forms a charge trapping dielectric 408 on the substrate 402 such that it covers the dummy feature 406 and select gates 404A and 404B. The charge trapping dielectric 408 can be a bottom layer of oxide beneath a layer of nitride with a top layer of oxide above the layer of nitride. The method disposes a second layer of poly 410 over the charge trapping dielectric 408. One advantage of disposing the charge trapping dielectric 408, or at least a bottom oxide layer, is that the layer provides insulation to support high voltages on the contact 416. A thick dielectric underneath the dummy feature 406 may be particularly advantageous.

Figure 4C:
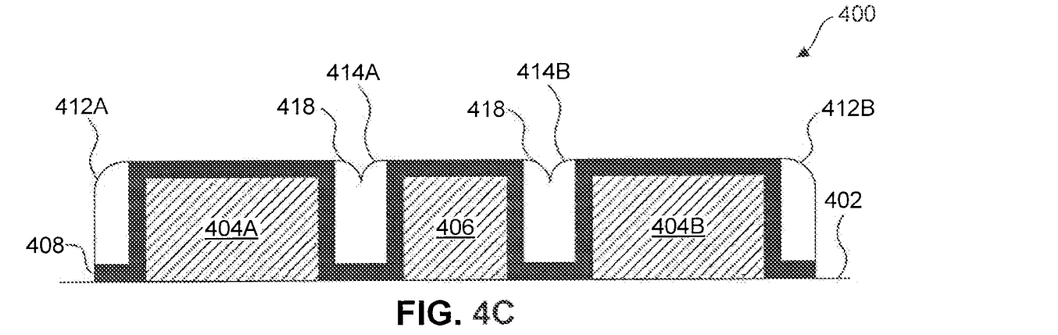

FIG. 4C illustrates a later step in the method of fabrication to form an intermediate semiconductor device 400. The method etches the second poly layer back to create a memory gate 418 that fills the space between select gate 404A and select gate 404B. The etching process creates sidewalls 412A-412B on the select gates 404. The etching process is an isotropic etch. The etching process creates bridges 414A-414B in the filled memory gate 418 rather than creating sidewalls 412. One reason for the bridge 414A-414B 414B creation is that etching generally removes an outer layer of exposed material, where the depth of the outer layer is a function of the length of time the etching occurred, as well as the strength or concentration of the etchant. Bridges 414A-414B are formed because the etchant does not remove enough of the second layer of poly to disconnect it from the adjacent features. As depicted in FIG. 4C, the bridges 414A-414B may be without a divot feature from their top, or may have a catenary across their top. An advantage of the dummy feature 406 is that it can help ensure that a portion of the memory gate 418 forms into a bridge 414 rather than the memory gate 418 becoming sidewalls 412. Another advantage of the dummy feature 406 is that it can provide a flat top surface as a landing area for the contact 416.

Figure 4D:
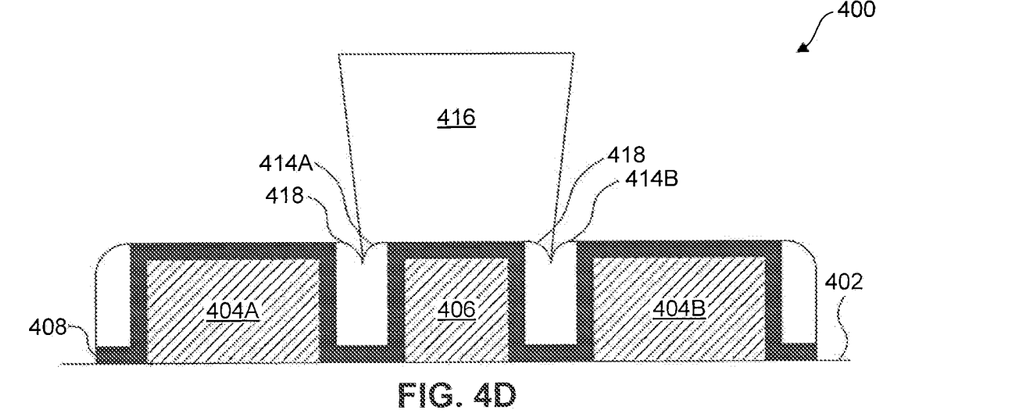
Figure 5A:
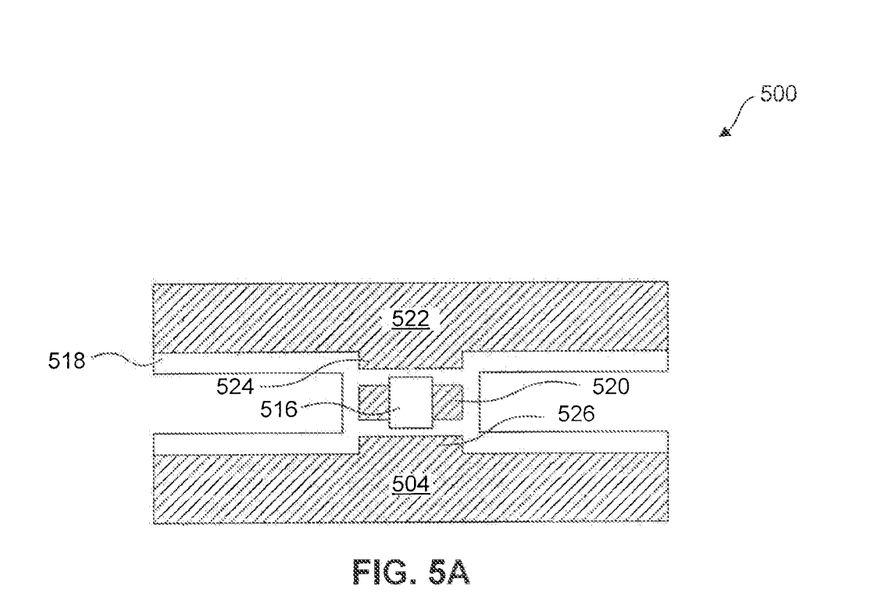
FIG. 5A is a top view of a semiconductor device, according to an embodiment.
Figure 5B:
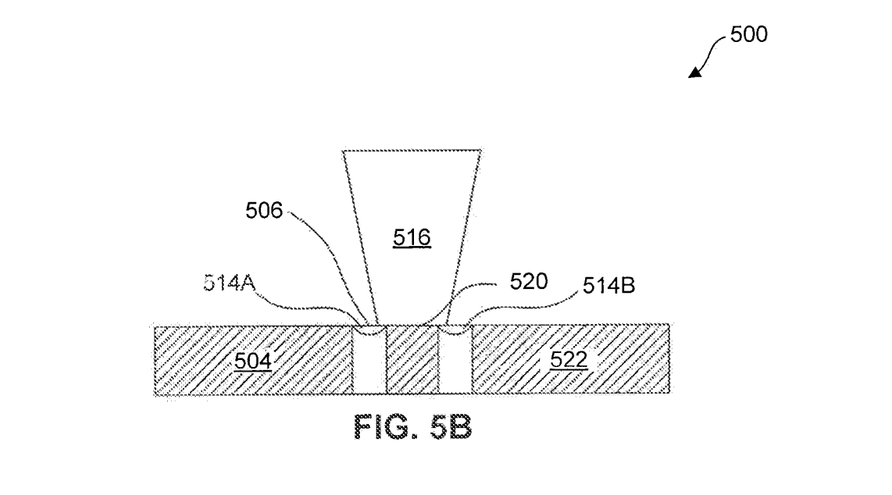
FIG. 5B is a side view of the semiconductor device of FIG. 5A.

FIG. 4D illustrates a later step in the method of fabrication to form an intermediate semiconductor device 400. The method disposes a contact 416. The contact 416 is on the dummy feature 406 and the bridging portions 414A-414B of the memory gate 418. The contact 416 is made of metal, but can also be made of poly. FIGS. 5A and 5B show a top view and a side view of the same alternative embodiment of a semiconductor device 500. The contact 516 is disposed across a dummy feature 520 and a memory gate 518. The memory gate 518 and the select gate 504 are components of a memory cell that is electrically connected to the contact 516 because the contact 516 is at least partially on the memory gate 518.

The semiconductor device 500 of FIG. 5A has additional dummy features. The largest dummy feature 522 has a size approximately equivalent to the size of the select gate 504. In one embodiment, the dummy feature 522 could instead be another select gate. The largest dummy feature 522 features a peninsula 524 that is integral to the dummy feature 522 but emerges from the rest of the dummy feature 522 on three sides, whereas what would be the fourth side is integral to the dummy feature 522.

The next largest dummy feature 520 is a freestanding dummy feature. A top surface of the dummy feature 520 is up to about twice as long as a contact surface of the contact 516 at their junction.

The smallest dummy feature 526 is integral to the select gate 504. It is preferred that the contact 516 not be in contact with the smallest dummy feature 526 because the smallest dummy feature 526 is electrically integral to the select gate 504. The lack of contact between the contact 516 and the select gate 504 maintains the electrical isolation between the dummy feature 520 and the select gate 504. The poly designated as the dummy feature 526 can be optimized to be close enough to the freestanding dummy feature 520 that etching the memory gate 518 between the dummy features 520 and 526 leaves a bridge 514A, rather than etching all the way through the memory gate 518 to expose the substrate or the charge trapping dielectric. In other embodiments, the dummy features can be made of different materials than the select gate 504.

Whether a bridge is created is primarily a function of two variables, the minimum width and the etching characteristics of material used. For example, if a sidewall memory gate 518 is to be 50 nm wide, then 60 nm of poly can be deposited to allow for etch back. If there is 60 nm of poly on either side of the adjacent features, a distance between the features of 120 nm or more will prevent a bridge from forming because the etching can traverse down through the poly. It is expected that distances less than 100 nm will be short enough to serve as bridging distances. Whether two features are close enough together to form a bridge 514 is also a function of manufacturing tolerances, such as the amount of etchant applied. The dimensions are provided for example, not by limitation.

Figure 6:
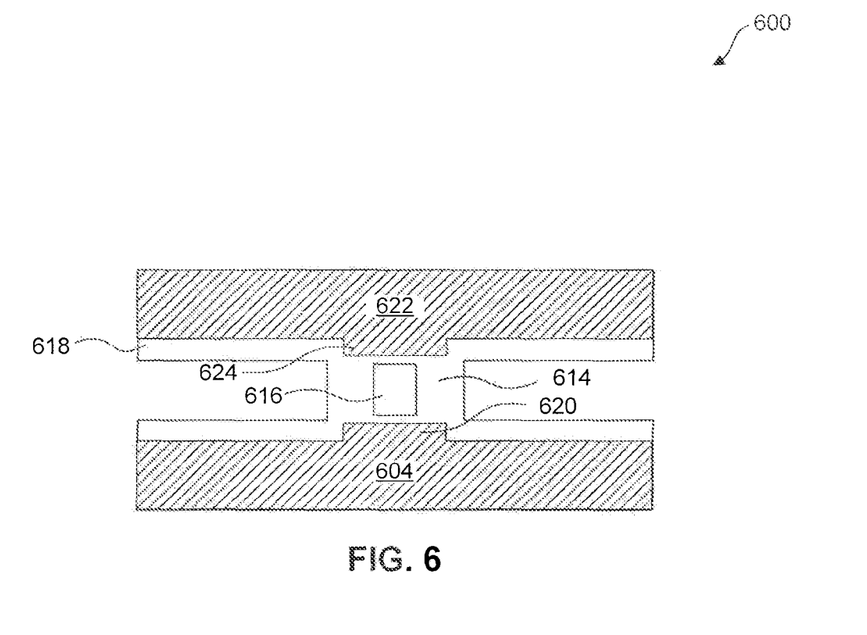
FIG. 6 is a top view of a semiconductor device, according to an embodiment.

FIG. 6 is an alternative embodiment of a semiconductor device 600 with a contact 616 disposed on a bridge 614. In the semiconductor device 600, the contact 616 is entirely on the bridge 614. One advantage of landing the contact 616 on the bridge 614 and not on a dummy feature is that the distance across the bridge 614 is likely shorter than the distance across a dummy feature with a bridge 614 on either side of the dummy feature. This shorter distance can be valuable because it allows active device features to be disposed closer together. Another advantage of placing the contact on the bridge and not on a dummy feature is that the area of the contact directly in contact with the memory gate is larger so the electrical resistance is lower. Yet another advantage of placing the contact on the bridge and not on a dummy feature is that the dummy feature does not need to be sufficiently isolated from the substrate to withstand a high potential on the contact. Conversely, one advantage of landing a contact 616 on a dummy feature is a higher tolerance for contact 616 misalignment due to the larger target area.

Figure 7A:
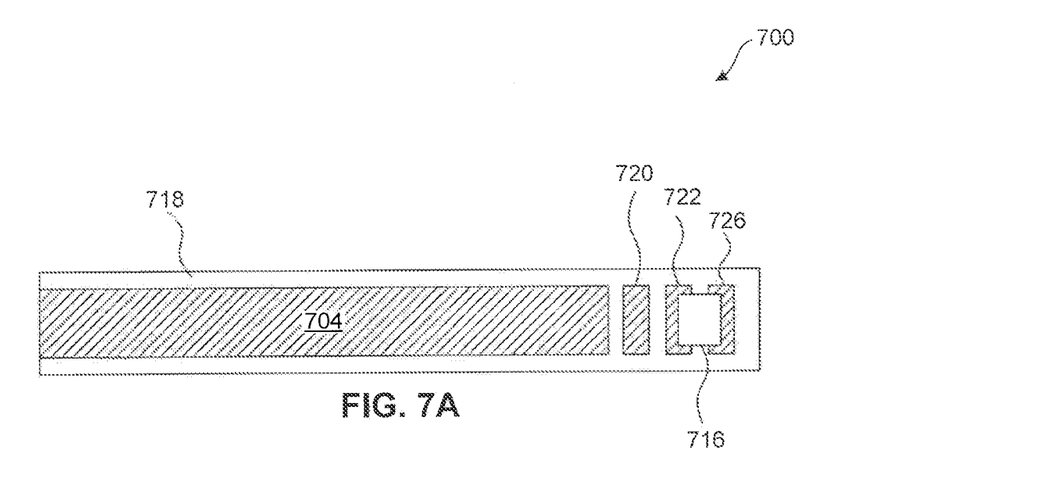
FIG. 7A is a top view of a semiconductor device, according to an embodiment.
Figure 7B:
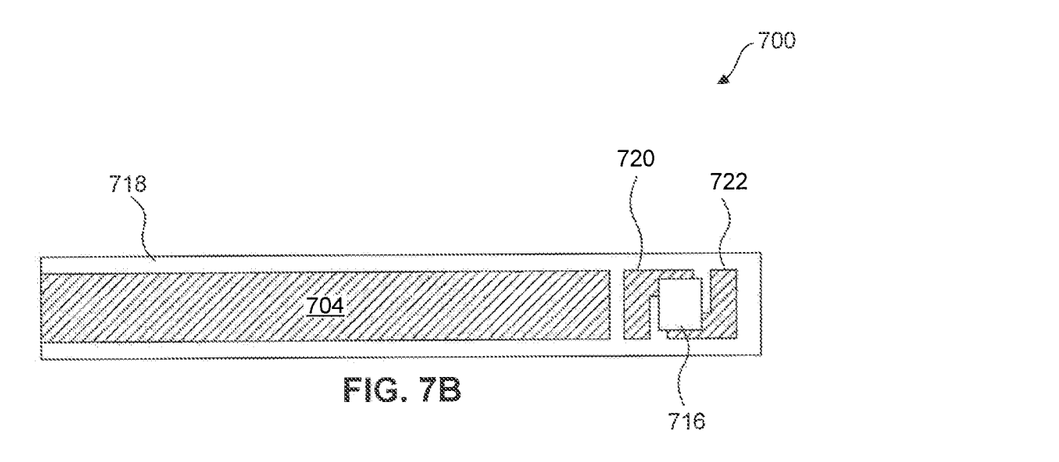
FIG. 7B is a top view of a semiconductor device, according to an embodiment.

FIGS. 7A and 7B are alternative embodiments of semiconductor devices 700 with a contact 716 disposed at the end of a line, such as a select gate 704. Dummy features are disposed to allow the contact 716 to be disposed in contact with the memory gate 718 without contacting the select gate 704.

Figure 8:
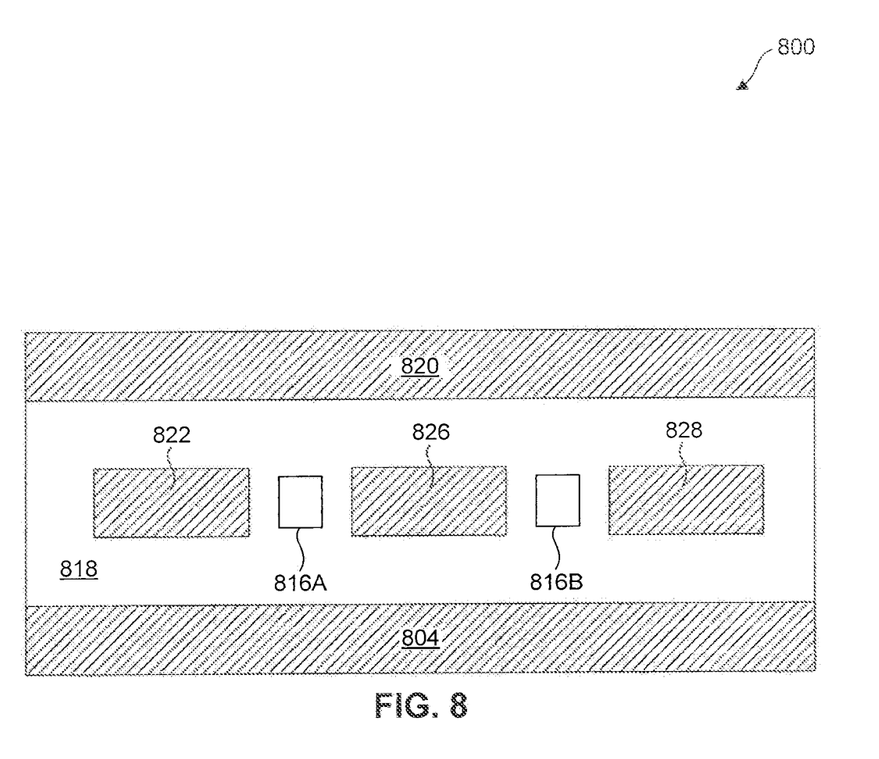
FIGS. 8-12 are top views of various semiconductor devices, according to various embodiments.

FIG. 8 is an alternative embodiment of a semiconductor device 800 with a series of contacts 816 between a select gate 804 and a dummy feature 820. Each contact 816 to a single target, such as the memory gate 818, can allow a different semiconductor element to connect to the target. If all of the contacts 816 to the single target are connected to the same semiconductor element on the other side, then the group of contacts 816 can provide a lower resistance than just one of the contacts 816.

Figure 9:
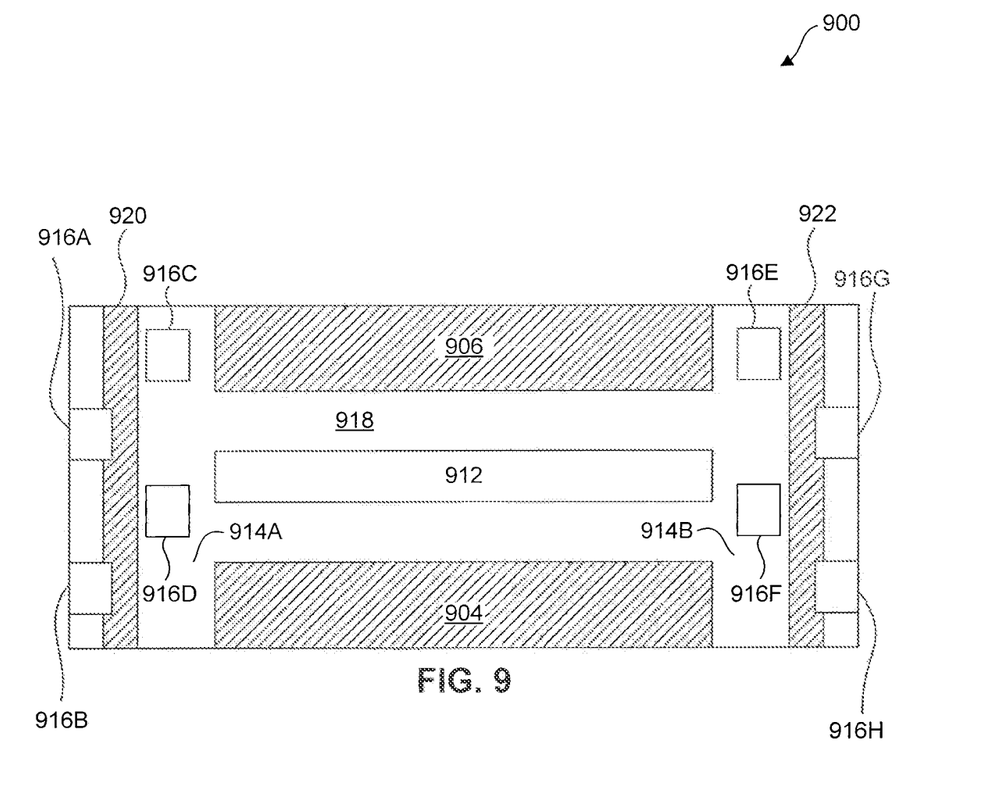

FIG. 9 is an alternative embodiment of a semiconductor device 900 with a plurality of contacts 916. Some of the contacts 916B, 916D, 916F and 916H are partially on a dummy feature and partially on poly. The dummy features 920 and 922 are perpendicular to the select gate 904 such that they form bridges 914A and 914B. Because the bridges 914A and 914B are in one direction, the exact vertical and horizontal position of the contacts is less critical—i.e., there is greater tolerance for overlay misalignment. A void 912 exists in the middle of the semiconductor device 900.

Figure 10:
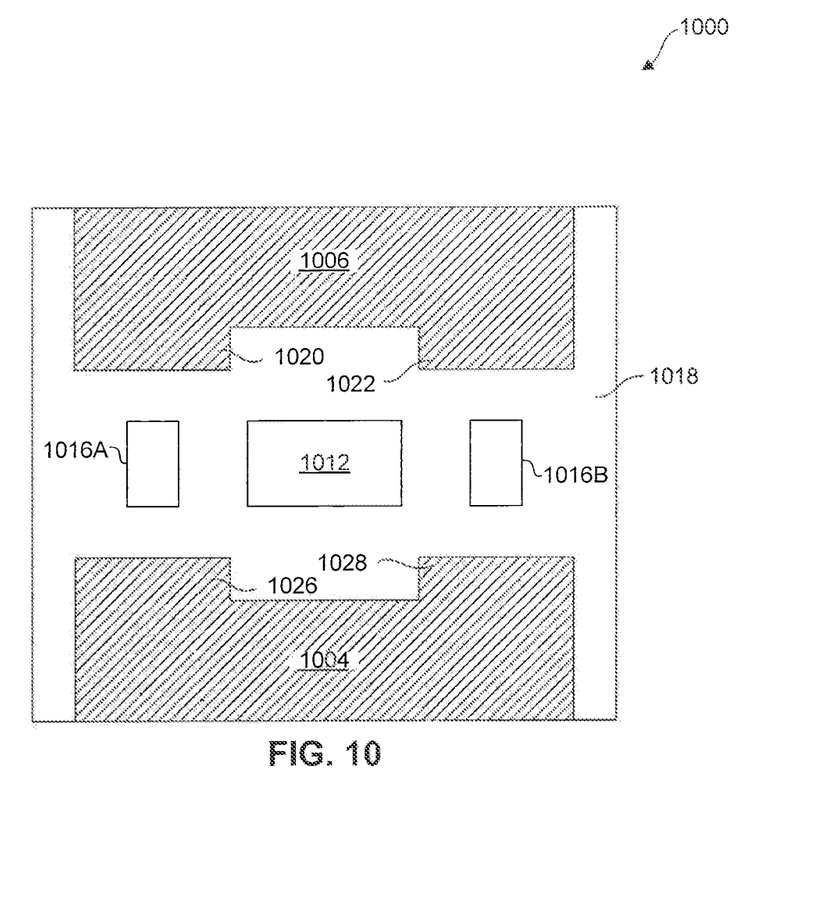

FIG. 10 is a semiconductor device 1000 with contacts 1016 on a memory gate 1018 between two select gates 1004 and 1006.

Figure 11:
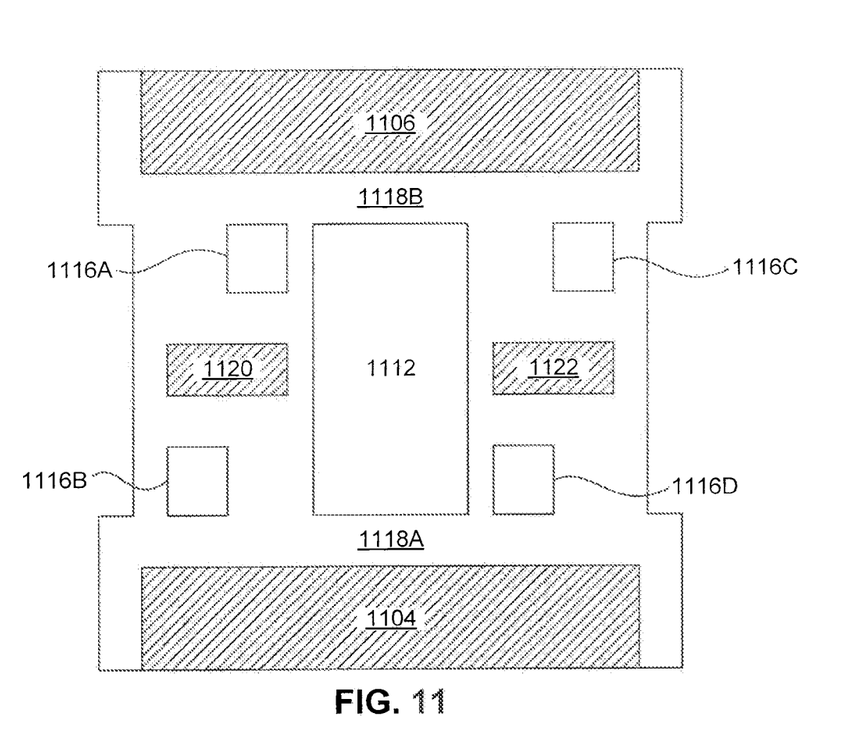

FIG. 11 is a semiconductor device 1100 with four contacts 1116A-1116D between two select gates 1104 and 1106. The semiconductor device 1100 also comprises dummy features 1120 and 1122, memory gates 1118A and 1118B and a void 1112.

Figure 12:
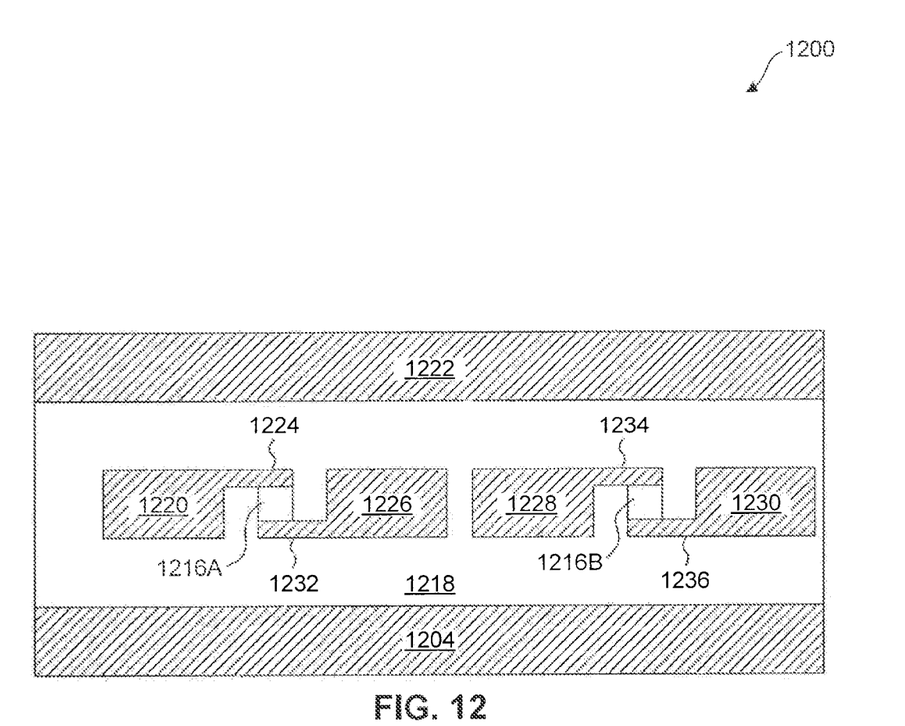

FIG. 12 is a semiconductor device 1200 with two contacts 1216A and 1216B between a select gate 1204 and a dummy feature 1222. The contacts are on peninsulas 1224, 1232, 1234 and 1236 integral to dummy features 1220, 1226, 1228 and 1230.

In the previous discussion, the select gate is formed earlier with the memory gate formed later as a sidewall. However, other arrangements are possible within the scope of this invention. For example, the memory gate may be formed earlier with the select gate formed later as a sidewall. A memory cell gate can be either a select gate or a memory gate, as both are elements of a memory cell. A counterpart memory gate can be the other type of memory cell gate. For example, if there is a select gate on a substrate, then a memory gate could be a counterpart memory cell gate because the memory gate can be added to the select gate in order to form a memory cell. Conversely, if there is a memory gate on the substrate, then a select gate could be a counterpart memory cell gate.

While embodiments have been described herein with reference to charge trapping memory, the invention is not limited to these examples. Instead, embodiments of the invention are applicable to other types of semiconductor devices, such as other types of computer memory or logic gates. The invention is useful for both charge-trapping and floating-gate devices. This invention may be implemented with multi-level cells or other multi-bit memory technologies.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A semiconductor device, comprising:
   a substrate;
   a first memory cell gate disposed on the substrate;
   a dummy feature disposed on the substrate;
   a counterpart memory cell gate disposed on the substrate, wherein the counterpart memory cell gate is located between the first memory cell gate and the dummy feature so as to form a bridge portion that is below opposing edges of the first memory cell gate and the dummy feature; and
   a contact at least partially disposed on the bridge portion and at least partially disposed on the dummy feature, wherein the counterpart memory cell gate is a memory gate disposed over a charge trapping dielectric.

2. The semiconductor device of claim 1, further comprising a dielectric disposed underneath the dummy feature.

3. The semiconductor device of claim 1, wherein the dummy feature is electrically isolated from the first memory cell gate.

4. The semiconductor device of claim 1, wherein a top surface of the dummy feature is up to about twice as long as a contact surface of the contact.

5. The semiconductor device of claim 1, wherein a location of the contact is between the dummy feature and at least one of the first memory cell gate and a second dummy feature.

6. The semiconductor device of claim 1, wherein a top surface of the dummy feature is up to twice as long as a contact surface of the contact.

7. The semiconductor device of claim 1, wherein the dummy feature is a peninsula.

8. The semiconductor device of claim 1, wherein the contact is also at least partially disposed on a second bridge portion.

9. The semiconductor device of claim 1, wherein the counterpart memory cell gate is adjacent to the first memory cell gate and the dummy feature.

10. A method of fabricating a semiconductor device, comprising:
    disposing a gate layer on a substrate;
    forming a plurality of features in the gate layer including a memory cell gate and at least one dummy feature;
    disposing an insulator over the plurality of features;
    disposing a further gate layer on the plurality of features;
    removing a portion of the further gate layer to form a counterpart memory cell gate between the memory cell gate and the one dummy feature, wherein a distance between the memory cell gate and the one dummy feature is less than a bridging distance so as to form a recess portion in the counterpart memory cell gate; and
    forming a contact on at least the recess portion of the counterpart memory cell gate and at least a portion of the dummy feature, wherein the counterpart memory cell gate is a memory gate disposed over a charge trapping dielectric.

11. The method of fabricating a semiconductor of claim 10, further comprising disposing a dielectric on the substrate before forming the dummy feature, wherein forming the dummy feature leaves the dummy feature on a thick dielectric.

12. The method of fabricating a semiconductor of claim 10, further comprising electrically isolating the dummy feature from the counterpart memory cell gate.

13. The method of fabricating a semiconductor of claim 10, wherein a top surface of the dummy feature is formed to be up to twice as long as a contact surface of the contact.

14. The method of fabricating a semiconductor of claim 10, wherein a location of the contact is between the dummy feature and a second dummy feature.

15. The method of fabricating a semiconductor of claim 10, wherein forming the contact further comprises forming the contact over a second recess portion.

* * * * *